(12) United States Patent
Takeya et al.

(10) Patent No.: US 8,000,597 B2
(45) Date of Patent: Aug. 16, 2011

(54) INPUT DEVICE

(75) Inventors: Tsutomu Takeya, Niigata-ken (JP); Yasunoi Sasaki, Niigata-ken (JP); Takashi Onodera, Niigata-ken (JP); Keiji Ito, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 12/652,487

(22) Filed: Jan. 5, 2010

(65) Prior Publication Data

US 2010/0104275 A1    Apr. 29, 2010

Related U.S. Application Data

(63) Continuation of application No. PCT/JP2008/062737, filed on Jul. 15, 2008.

(30) Foreign Application Priority Data

Jul. 20, 2007   (JP) ................................ 2007-189102

(51) Int. Cl.
*G03B 17/00* (2006.01)
*H03K 17/94* (2006.01)
*H03M 11/00* (2006.01)

(52) U.S. Cl. ............. 396/299; 396/85; 396/543; 341/35

(58) Field of Classification Search .............. 396/85–87, 396/29, 25, 543, 299; 341/32, 35
See application file for complete search history.

(56) References Cited

U.S. PATENT DOCUMENTS 6,223,000 B1 * 4/2001 Funakoshi et al. ............. 396/299
7,082,265 B2 * 7/2006 Nishiwaki ....................... 396/85
2002/0057026 A1    5/2002 Taniguchi 2003/0001705 A1   1/2003 Sugiyama et al.
2003/0070497 A1   4/2003 Kikuchi et al.
2004/0119687 A1   6/2004 Suzuki et al.
2006/0278011 A1 * 12/2006 Miyasaka et al. ............... 73/753
2007/0222343 A1 *  9/2007 Kang .......................... 310/68 R

FOREIGN PATENT DOCUMENTS

| JP | 02-225664 | 9/1990 |
| JP | 03-138360 | 6/1991 |
| JP | 2005-274718 | 10/2005 |
| JP | 2006-196212 | 7/2006 |
| JP | 2006-226952 | 8/2006 |
| JP | 2006-304002 | 11/2006 |
| JP | 2007-109437 | 4/2007 |
| WO | 2007/043576 A1 | 4/2007 |

* cited by examiner

*Primary Examiner* — Clayton E LaBalle
*Assistant Examiner* — Noam Reisner
(74) *Attorney, Agent, or Firm* — Brinks Hofer Gilson & Lione

(57) ABSTRACT

An input device for zooming and shutter releasing includes a shutter release button; a pressing protrusion; a tact switch located on a substrate and configured to be pressed when the shutter release button is pressed downward; a rotary member rotatably supported at the periphery of the shutter release button; a magnet configured to be rotated in association with rotation of the rotary member, the magnet having a through hole at the center thereof, the pressing protrusion supported to extend through the through hole; and a magnetic sensor located at a position to face the through hole in the height direction and configured to detect a rotational magnetic field that is generated by the magnet because of the rotation of the rotary member, the tact switch and the magnetic sensor arranged side by side on the substrate.

8 Claims, 13 Drawing Sheets

INPUT DEVICE

CLAIM OF PRIORITY

This application claims benefit of the Japanese Patent Application No. 2007-189102 filed on Jul. 20, 2007, which is hereby incorporated by reference.

BACKGROUND OF THE INVENTION

1. Field of the Invention

The present invention relates to an input device for zooming and shutter releasing for a camera.

2. Description of the Related Art

A recently used camera has a structure including a rotary member. The rotary member is provided rotatably at the periphery of a shutter release button and has a zoom lever. Hence, a shutter-releasing operation and a zooming operation can be easily performed with slight movement of a finger.

A shutter-releasing switch and a zooming switch are provided in a cameral body at positions close to one another.

In the above-described camera structure of related art, both the shutter-releasing switch and the zooming switch are mechanical switches. This may disturb reduction in size of the camera.

The technique disclosed in Japanese Unexamined Patent Application Publication No. 2005-274718 (hereinafter, referred to as document '718) includes a zooming switch having a plurality of printed contact pieces formed on a substrate and a brush-like contact piece coupled to a zoom lever. When the zoom lever is rotated, the sliding position of the brush-like contact piece against the printed contact pieces is changed. The change in sliding position results in zooming toward a wide-angle end (W), a neutral position, and a telephoto end (T).

Unfortunately, since the technique disclosed in the document '718 includes the zooming switch having the sliding-switch structure, long printed contact pieces have to be provided on the substrate by taking into account the rotation range of the zoom lever and the brush length of the brush-like contact piece. It is difficult to sufficiently meet reduction in size of a camera.

Also, since the technique disclosed in the document '718 includes the zooming switch having the sliding switch structure, such a structure tends to be subjected to wear, and it is difficult to increase the life of the switch.

Further, the technique disclosed in the document '718 has difficulty in increase in the number of steps for zooming. Hence, the technique cannot properly respond to high-magnification zooming demanded recently. For example, a volume switch may be provided to achieve a multistep switch. However, it is difficult to reduce the size of an input device.

SUMMARY OF THE INVENTION

The present invention is made to attain the above-described problems, and provides an input device capable of making a contribution to reduction in size of an input device for zooming and shutter releasing for a camera by using a magnetic sensor.

An input device according to an aspect of the present invention includes a push button; a pressing protrusion coupled to a lower surface of the push button and protruding downward; a switch section located below the pressing protrusion and configured to be pressed when the push button is pressed downward; a rotary member supported at the periphery of the push button rotatably around the center of the push button as a rotation center; a magnetic-field generating member located below the rotary member and configured to be rotated in association with rotation of the rotary member; and a magnetic sensor configured to detect a rotational magnetic field that is generated by the magnetic-field generating member because of the rotation of the rotary member.

With the aspect of the present invention, a sensor mechanism including the magnetic-field generating member and the magnetic sensor detects the rotation of the rotary member. Thus, reduction in size of the input device can be promoted as compared with the device of related art. Also, since the magnetic sensor does not contact the magnetic-field generating member, the long life of the members can be expected.

Further, since the sensor mechanism using the magnetic sensor detects the rotation of the rotary member, a linear output because of the rotation can be obtained. Multistep detection can be properly and easily provided.

Preferably in the above-described configuration, the magnetic-field generating member may have a through hole at the center thereof and is supported in such a manner as the pressing protrusion can extend through the through hole. The magnetic sensor and the switch section may be arranged side by side on a substrate, and the magnetic sensor may be located at a position to face the through hole in a height direction within a rotation range.

The size of the magnetic sensor can become markedly smaller than, for example, a mechanical switch or a sliding switch, for example, disclosed in the document '718. Since the magnetic sensor is arranged at a position close to the switch section, although the switch section and the magnetic sensor are arranged side by side on the substrate, the size of the substrate can be small. Since the magnetic-field generating member is arranged at the position such that the pressing protrusion can extend through the through hole, at least a part of the magnetic-field generating member can be located directly below the push button. Further, since the magnetic sensor is provided on the substrate, the magnetic-field generating member is arranged at the position close to the magnetic sensor, and hence the rotational magnetic field can be merely applied to the magnetic sensor thus arranged at the close position. Thus, the thickness of the magnetic-field generating member can be small, and the magnetic-field generating member can be properly arranged in the limited gap between the push button and the substrate. Accordingly, the input device can be further effectively reduced in size.

Preferably in the above-described configuration, the center of the pressing protrusion may be aligned with the rotation center. At a reference position or in a not-rotated state, a ratio $T1/L1$ of a center width $T1$ in a width direction of the through hole to a center length $L1$ in a length direction of the through hole may be larger than 1, the center width $T1$ passing through the center of the through hole and the center of the pressing protrusion, the center length $L1$ being orthogonal to the center width $T1$ at the center of the through hole. At least a part of a half of the magnetic-field generating member, and at least a part of the other half of the magnetic-field generating member with respect to the center width $T1$ in the width direction as the boundary may be polarized to different polarities. The magnetic sensor may be arranged at a position separated from the rotation center in the width direction of the through hole. With this configuration, since the center of the pressing protrusion is aligned with the rotation center, the magnetic sensor cannot be arranged at the rotation center because the switch section is arranged below the pressing protrusion, that is, at the rotation center. In this case, the shape of the through hole in the magnetic-field generating member and the installation position of the magnetic-field generating member are adjusted as described above. Thus, a linear rotational magnetic field tends to act on the magnetic sensor within the rotation range of the rotary member. The magnetic sensor can accurately detect the magnetic field.

Preferably in the above-described configuration, both side portions of the through hole may be parallel to the width direction (the X direction in the drawing), both the side portions facing one another with a gap interposed therebetween in the length direction over the center width T1. Accordingly, the magnetic field generated in the space (including the lower space accommodating the magnetic sensor) between both the side portions of the through hole becomes more linear. The magnetic sensor can accurately detect the magnetic field.

Preferably in the above-described configuration, the center of the through hole may be located at a position separated from the center of the pressing protrusion. The center of the pressing protrusion, the center of the through hole, and the center of the magnetic sensor may be arranged in a line in that order. Accordingly, because of the compact magnet, the installation area for the magnetic sensor located at the position to face the through hole in the height direction can be widened on the one side with respect to the pressing protrusion. Thus, the magnetic sensor and the switch section can be arranged side by side on the substrate. Also, when the rotary member is rotated counterclockwise or clockwise from the reference position (the not-rotated state), the rotation range of the rotary member for maintaining the state that the magnetic sensor faces the through hole in the height direction can be equally determined for the counterclockwise or clockwise rotation.

Preferably in the above-described configuration, the magnetic-field generating member may have a through hole at the center thereof and is supported in such a manner as the pressing protrusion can extend through the through hole. The magnetic sensor may be arranged on a lower surface of a substrate provided with the switch section, and the magnetic sensor may be located at a position to face the through hole in a height direction within a rotation range.

Preferably in the above-described configuration, the rotation center, the center of a through hole in the magnetic-field generating member, and the center of the magnetic sensor may be aligned in the height direction. Accordingly, the linear rotational magnetic field tends to act on the magnetic sensor, and the magnetic field can be accurately detected.

Preferably in the above-described configuration, the magnetic sensor may include a magnetoresistive element having an electric resistance that changes when a magnetization direction thereof changes due to the rotational magnetic field. Accordingly, the rotational magnetic field can be properly detected, and the detection accuracy can be increased. The magnetoresistive element can detect even a weak magnetic field as compared with, for example, a hall element. This can make contribution to the reduction in thickness of the magnetic-field generating member and to the reduction in size of the input device.

Preferably in the above-described configuration, the magnetoresistive element may include a first giant magnetoresistive element and a second giant magnetoresistive element connected to one another in series through an output extracting portion. Each of the first and second giant magnetoresistive elements may include a pinned magnetic layer having a pinned magnetization direction, a free magnetic layer having a magnetization direction that changes due to the rotational magnetic field, and a nonmagnetic material layer located between the pinned magnetic layer and the free magnetic layer. The magnetization directions of the pinned magnetic layers in the first and second giant magnetoresistive elements may be antiparallel to one another.

Preferably in the above-described configuration, the magnetoresistive element may further include a third giant magnetoresistive element and a fourth giant magnetoresistive element connected to one another in series through an output extracting portion. Each of the third and fourth giant magnetoresistive elements may include a pinned magnetic layer having a pinned magnetization direction, a free magnetic layer having a magnetization direction that changes due to the rotational magnetic field, and a nonmagnetic material layer located between the pinned magnetic layer and the free magnetic layer. The magnetization directions of the pinned magnetic layers in the third and second giant magnetoresistive elements may be the same. The magnetization directions of the pinned magnetic layers in the fourth and first giant magnetoresistive elements may be the same. The first and third giant magnetoresistive elements may be connected to one another through an input terminal, the magnetization directions of the pinned magnetic layers in the first and third giant magnetoresistive elements being antiparallel to one another. The second and fourth giant magnetoresistive elements may be connected to one another through a ground terminal, the magnetization directions of the pinned magnetic layers in the second and fourth giant magnetoresistive elements being antiparallel to one another. The two output extracting portions may be connected to an external output terminal through a differential amplifier.

Accordingly, the output can be increased, and the detection accuracy can be increased.

For example, preferably in the input device according to the aspect of the present invention, the pressing button may be a shutter release button, and the input device may be used for a camera having a zoom lever attached to a part of an outer peripheral portion of the rotary member.

DESCRIPTION OF THE PREFERRED EMBODIMENTS

Figure 1:
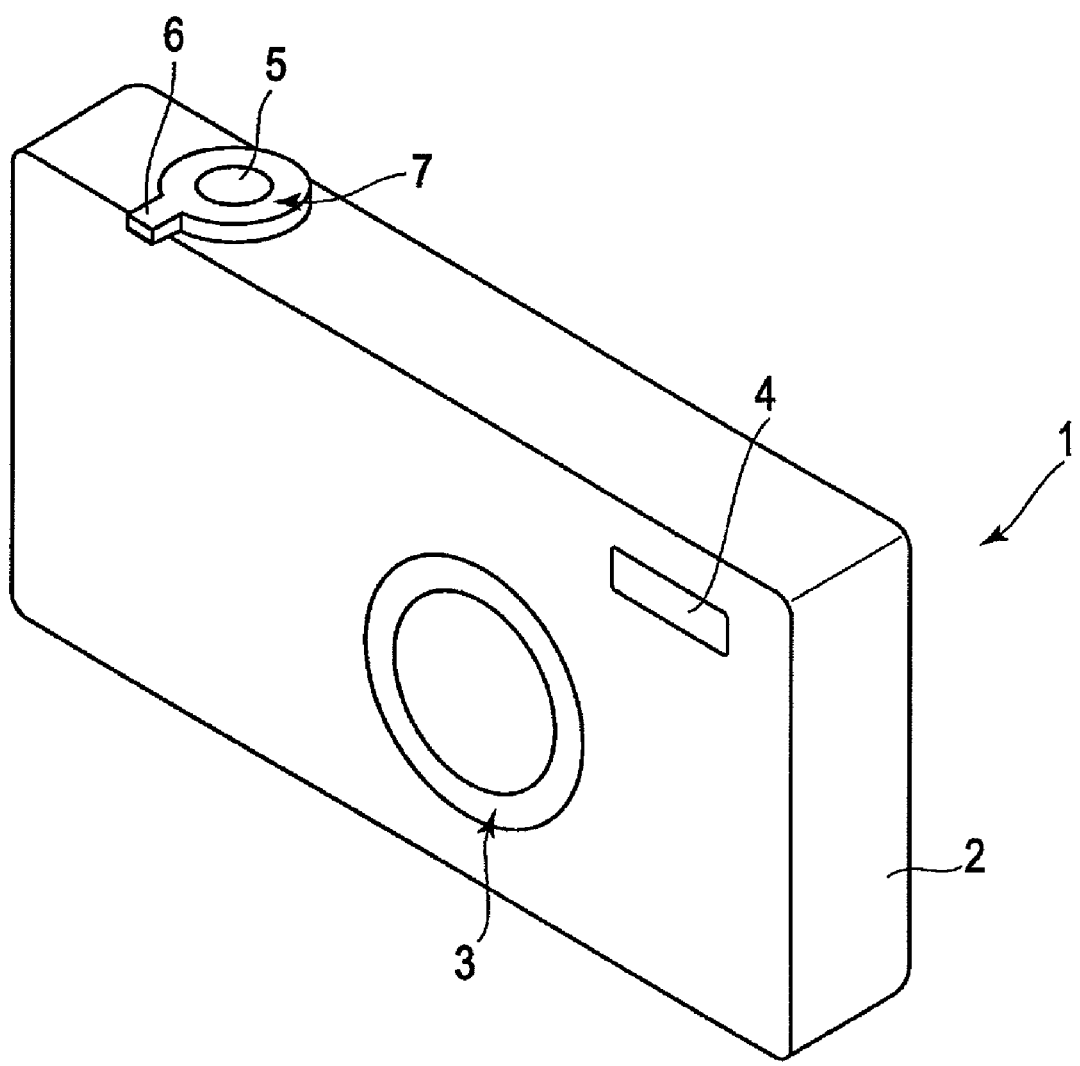
FIG. 1 is an external perspective view showing a camera.
Figure 2:
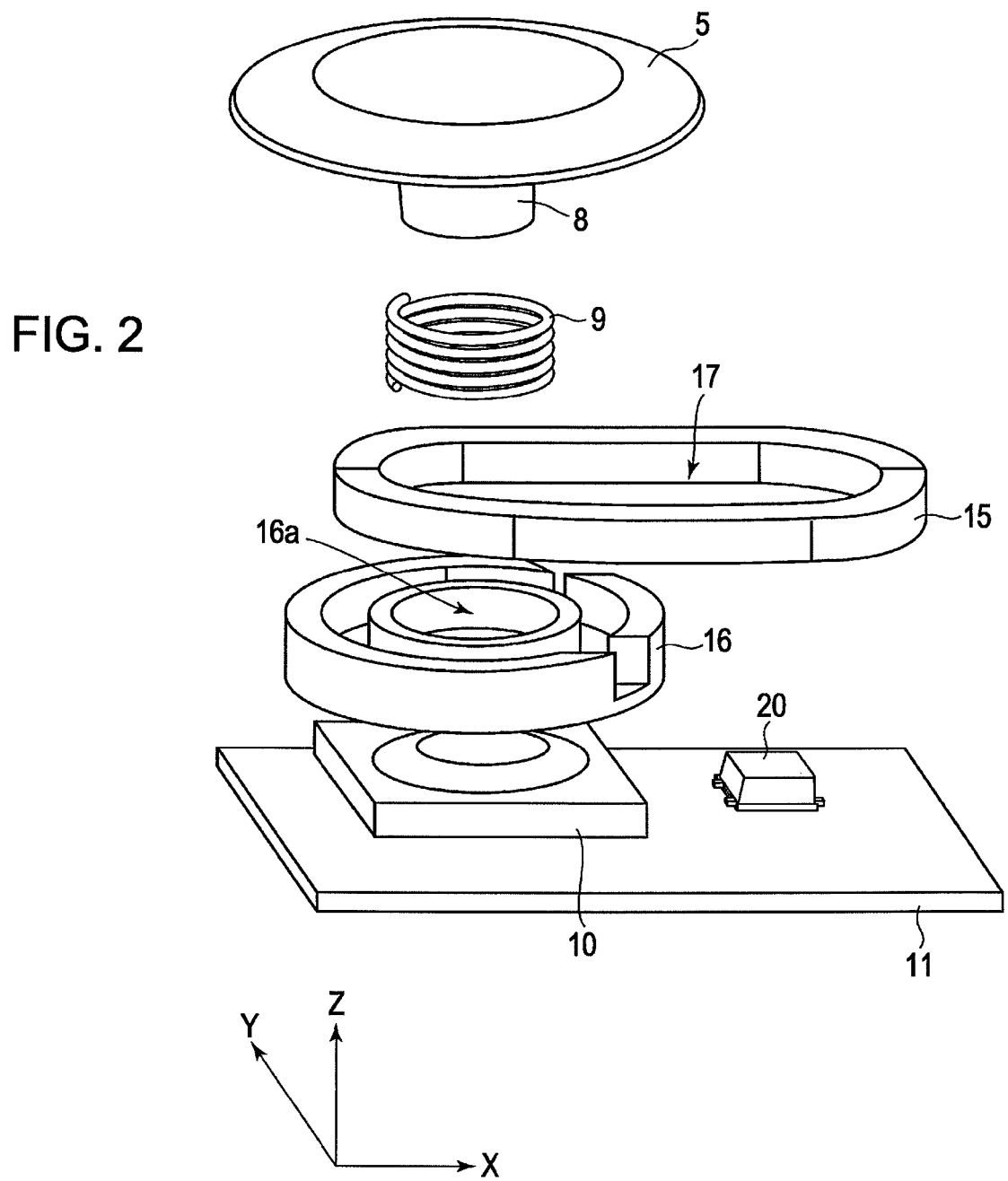
FIG. 2 is an exploded perspective view showing an input device according to a first embodiment of the present invention (a rotary member not shown)
Figure 3:
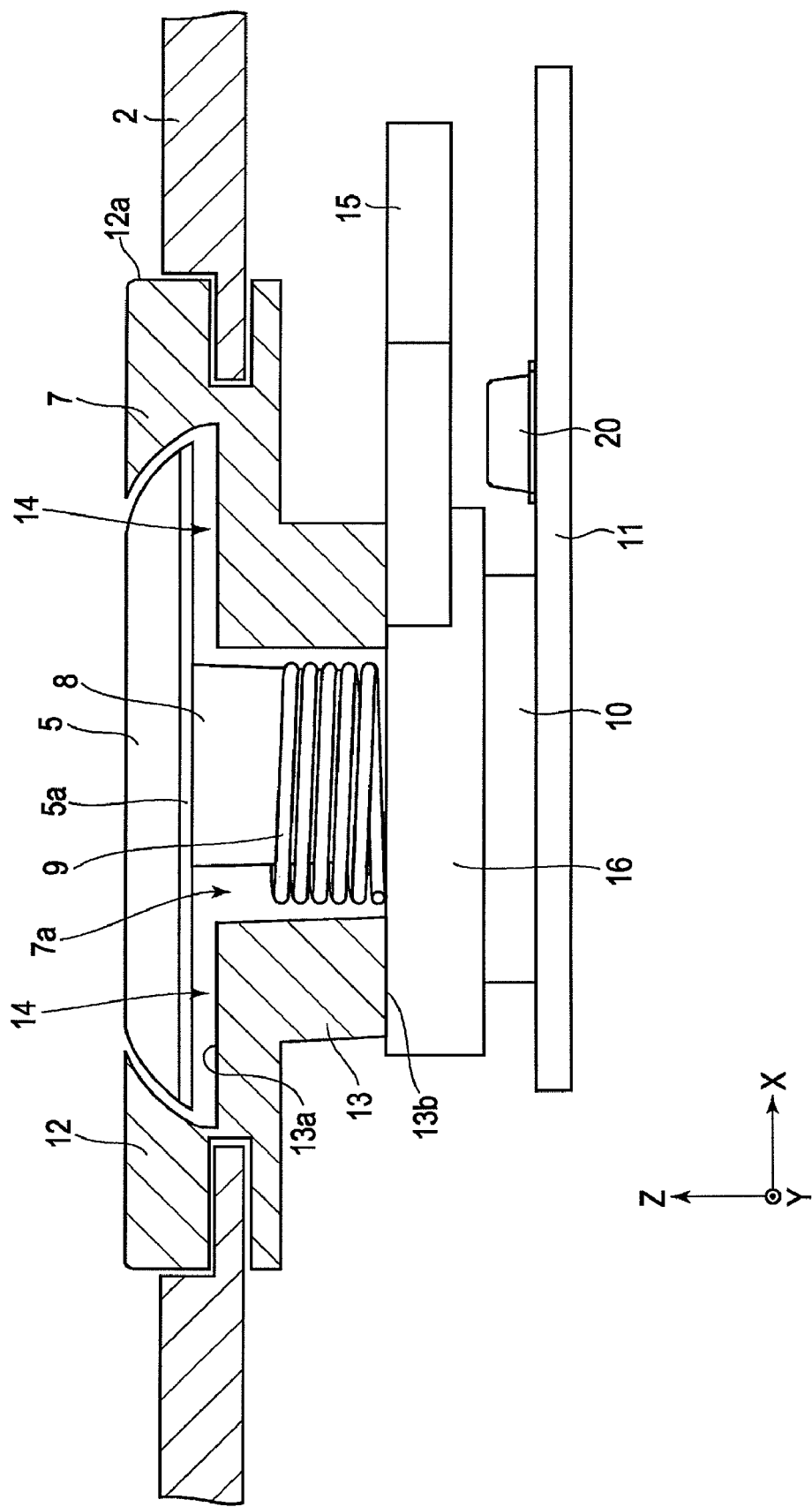
FIG. 3 is a side view showing the input device in FIG. 2 (the rotary member and a part of a camera body shown in a cross-sectional manner)
Figure 4:
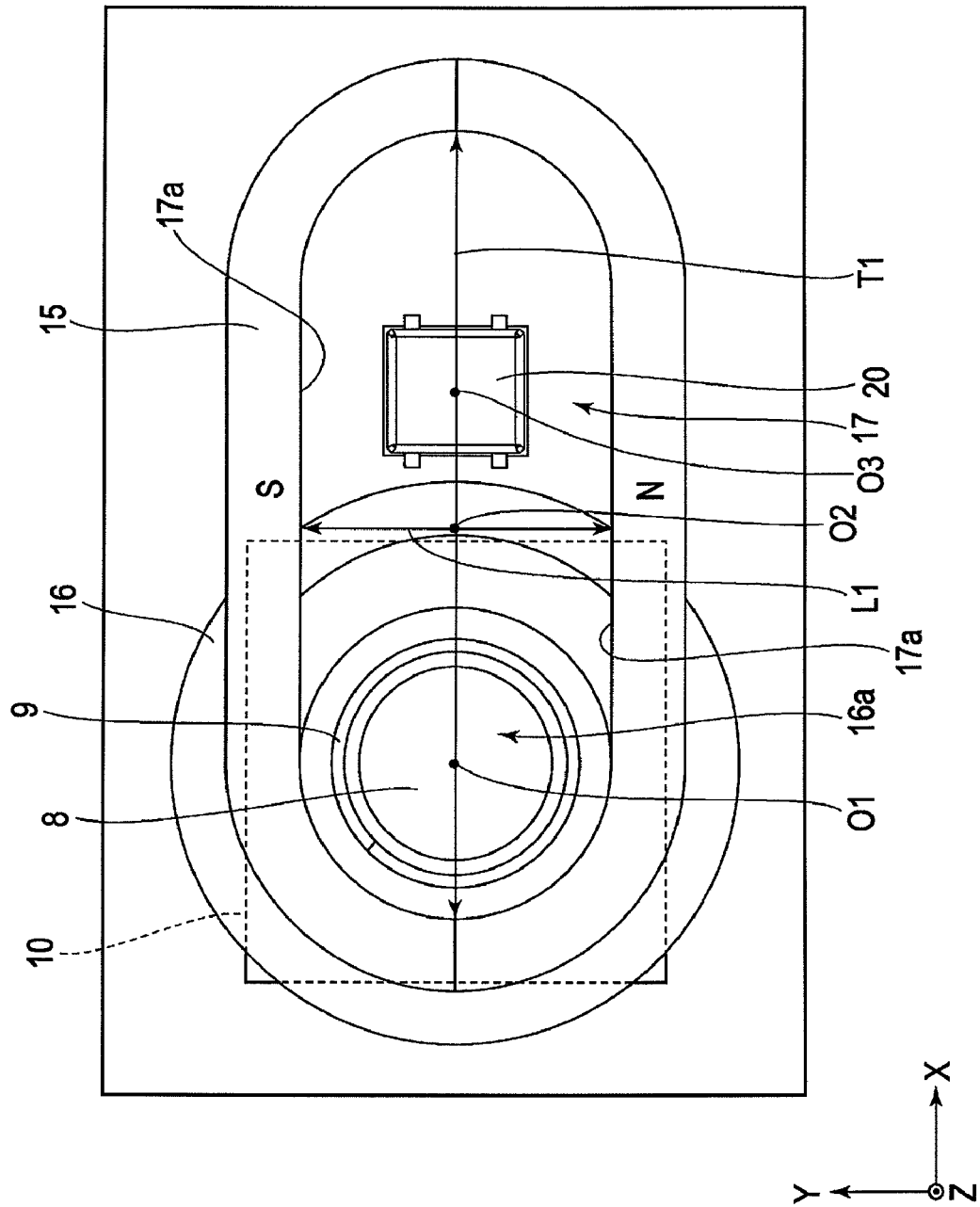
FIG. 4 is a plan view showing the input device in FIG. 3 (a shutter release button, the rotary member, and a part of the camera body not shown)
Figure 5:
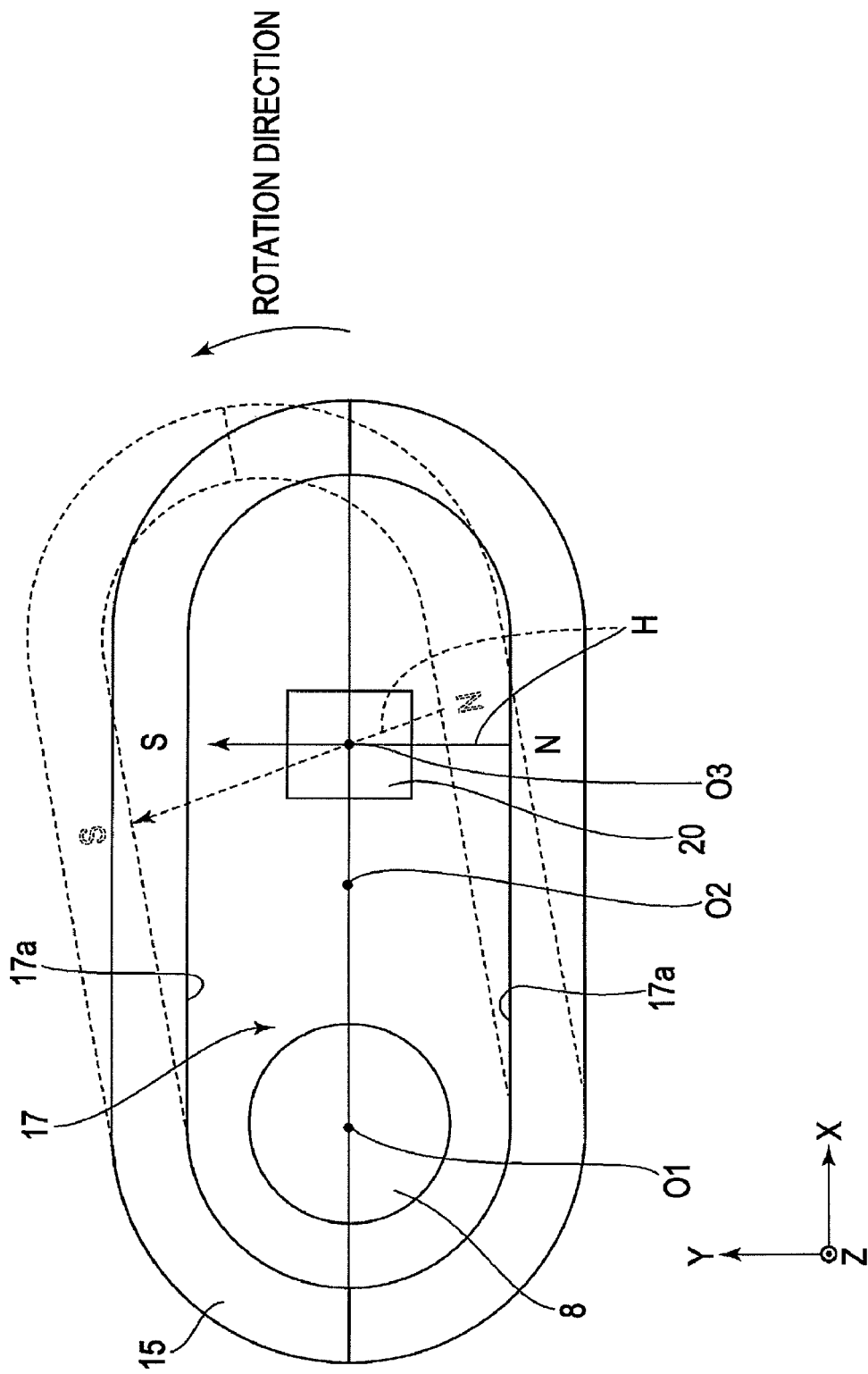
FIG. 5 is a schematic illustration showing a rotation range of a magnet and a rotational magnetic field acting on a magnetic sensor.
Figure 6:
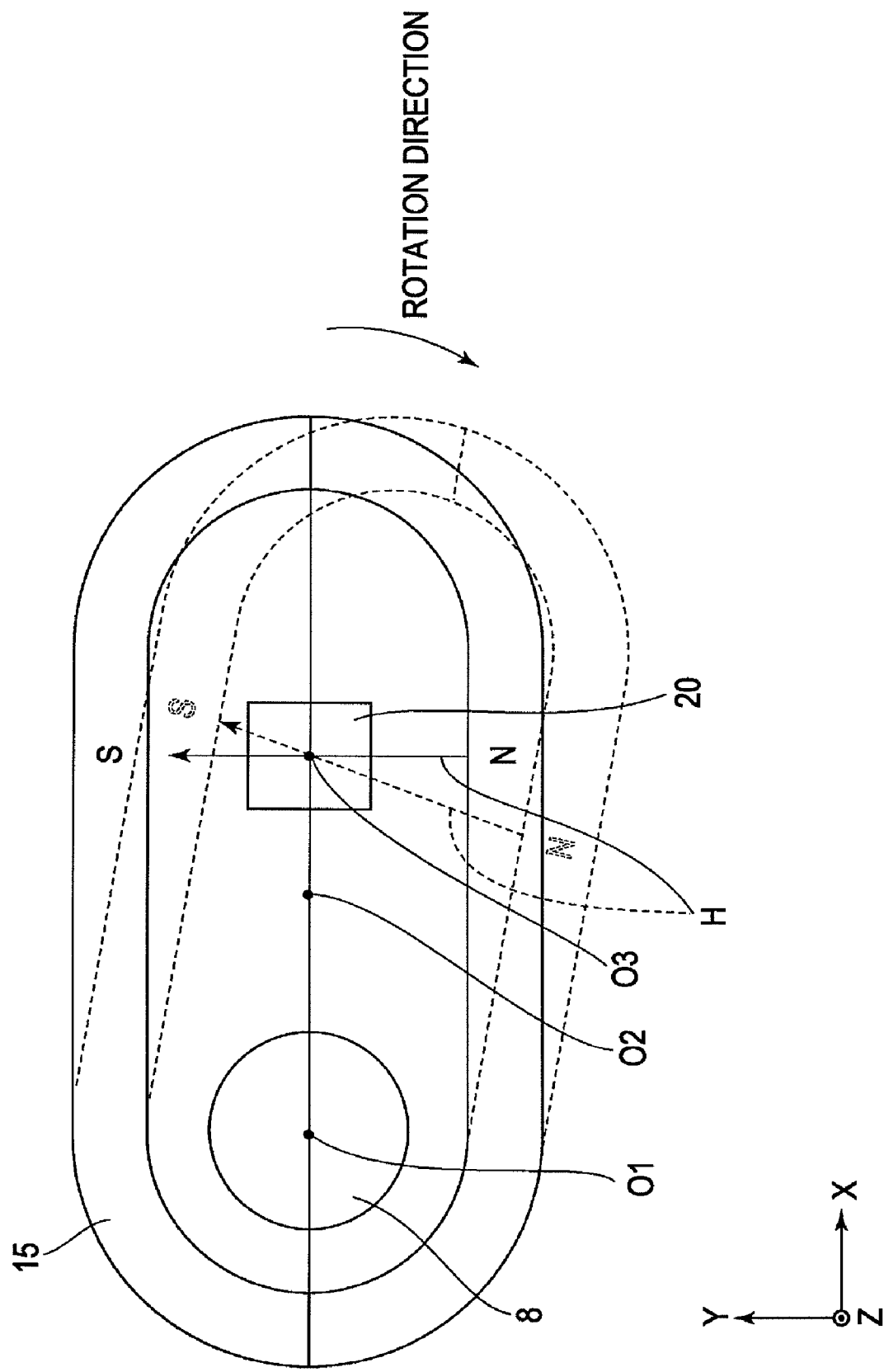
FIG. 6 is a schematic illustration showing a rotation range of the magnet and a rotational magnetic field acting on a magnetic sensor.
Figure 7:
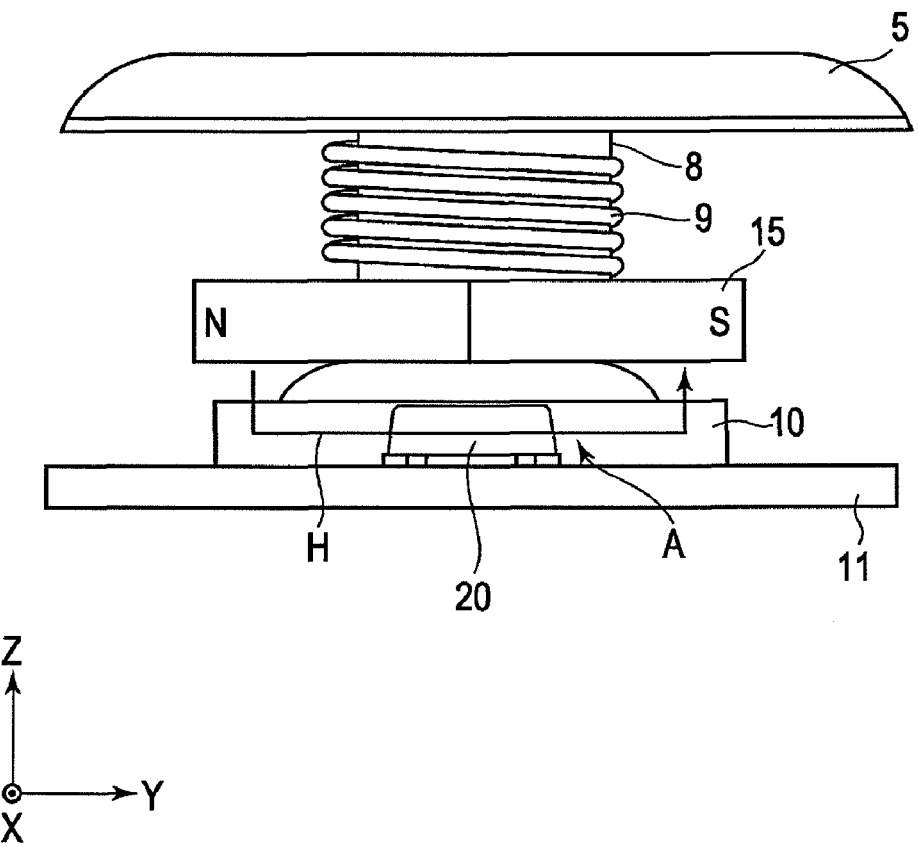
FIG. 7 is a front view showing the input device in FIG. 2 (a holder not shown)
Figure 8:
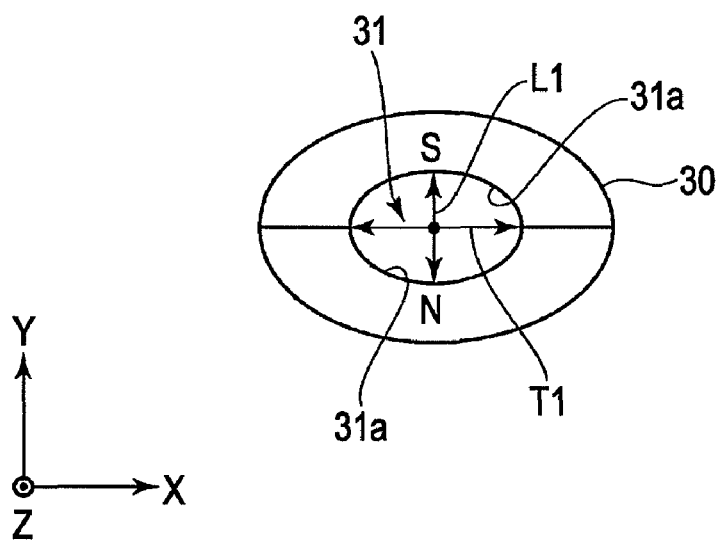
FIG. 8 is a plan view showing a magnet having a form different from the magnet shown in FIG. 4.
Figure 9:
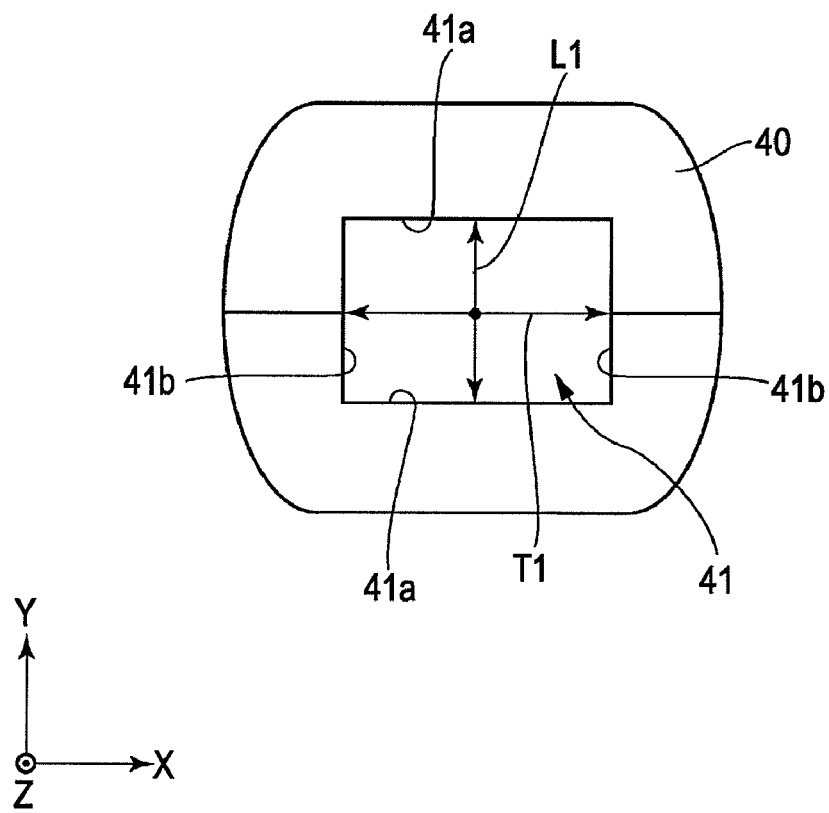
FIG. 9 is a plan view showing a magnet having a form different from the magnet shown in FIG. 4.
Figure 10:
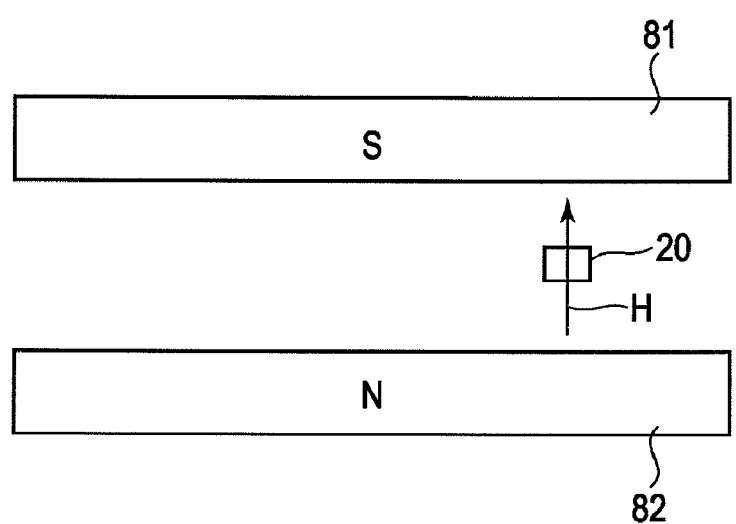
FIG. 10 is a plan view showing a magnet having a form different from the magnet shown in FIG. 4.
Figure 11:
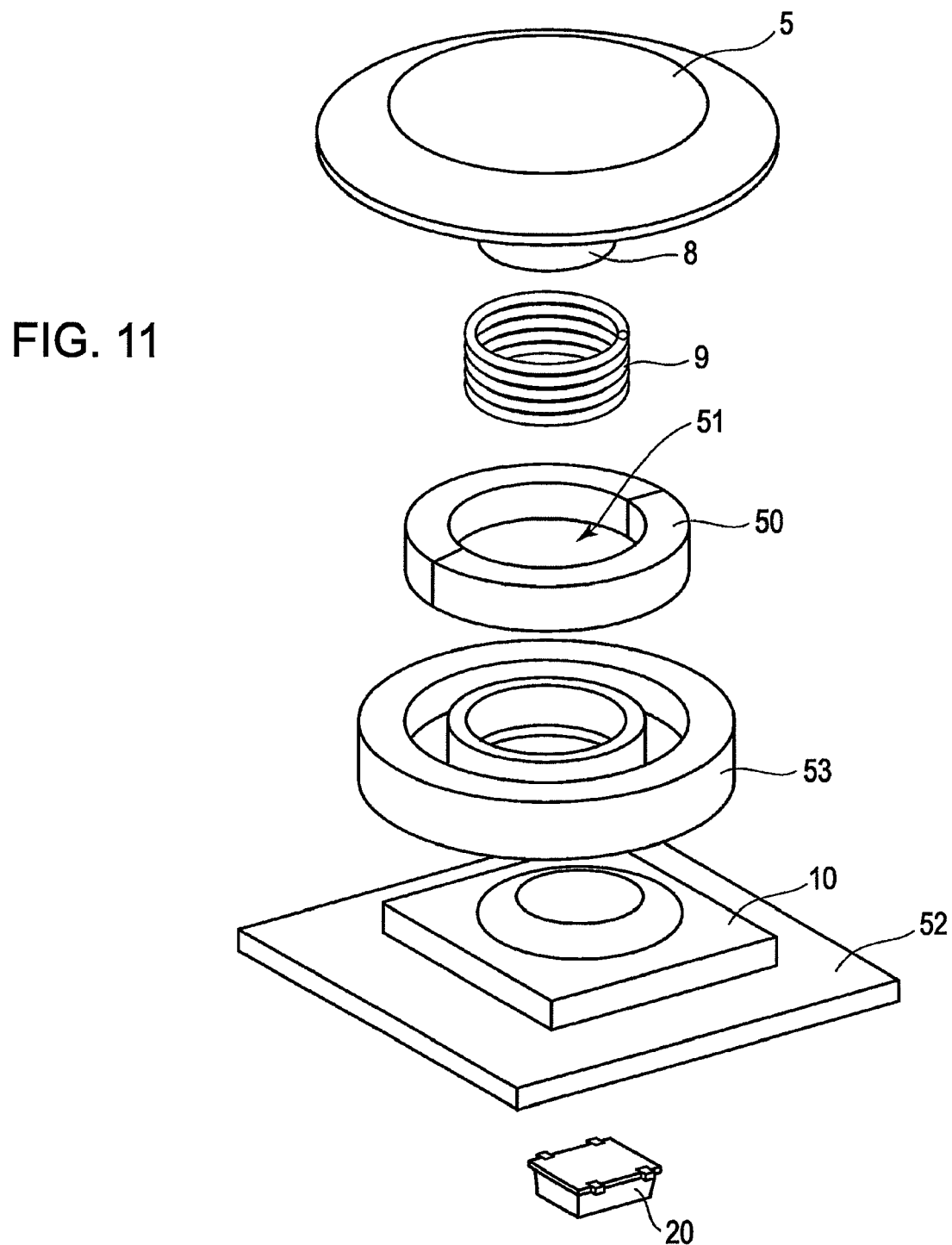
FIG. 11 is an exploded perspective view showing an input device according to a second embodiment of the present invention.
Figure 12:
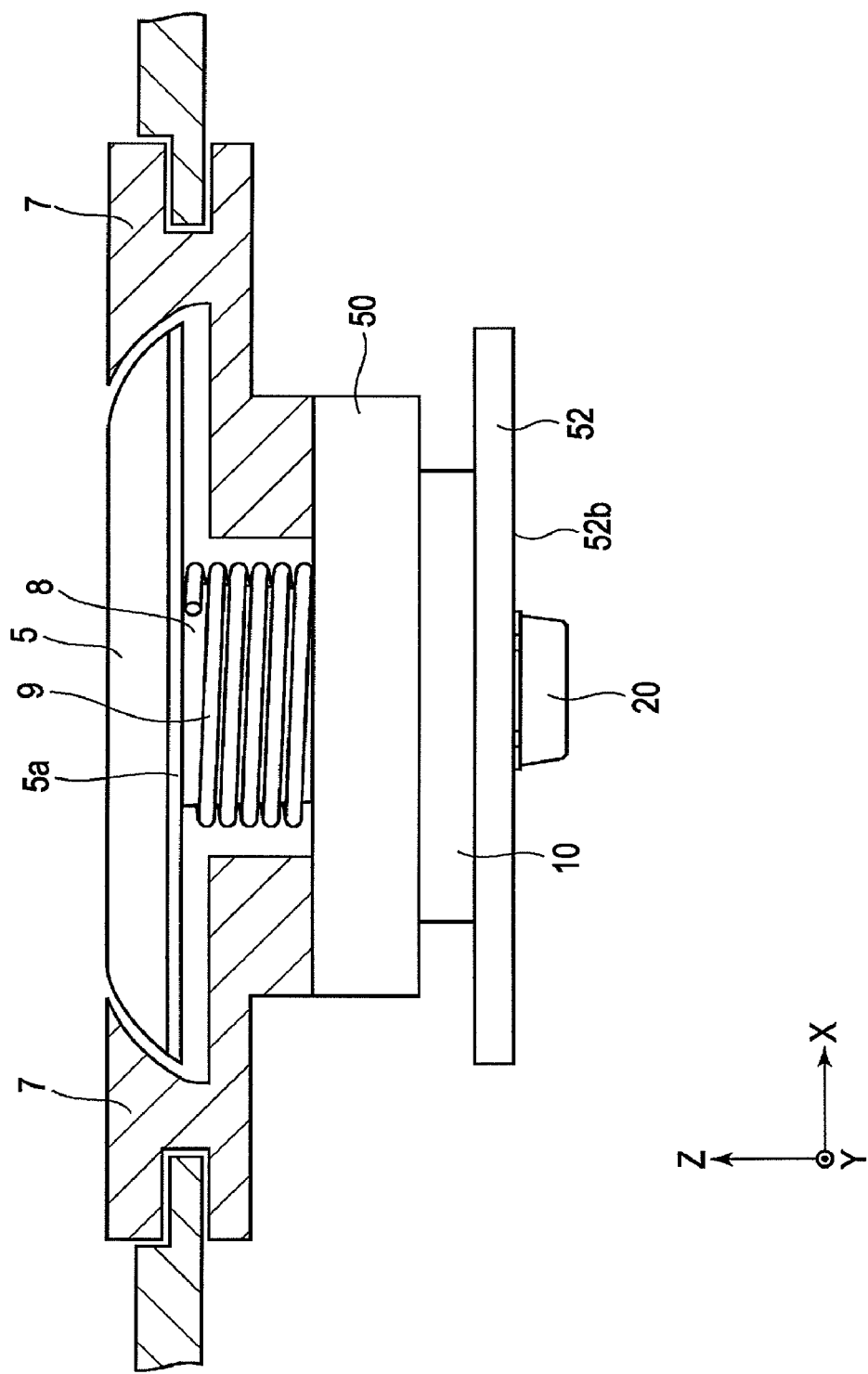
FIG. 12 is a side view showing the input device in FIG. 11 (a rotary member and a part of a camera body shown in a cross-sectional manner)
Figure 13:
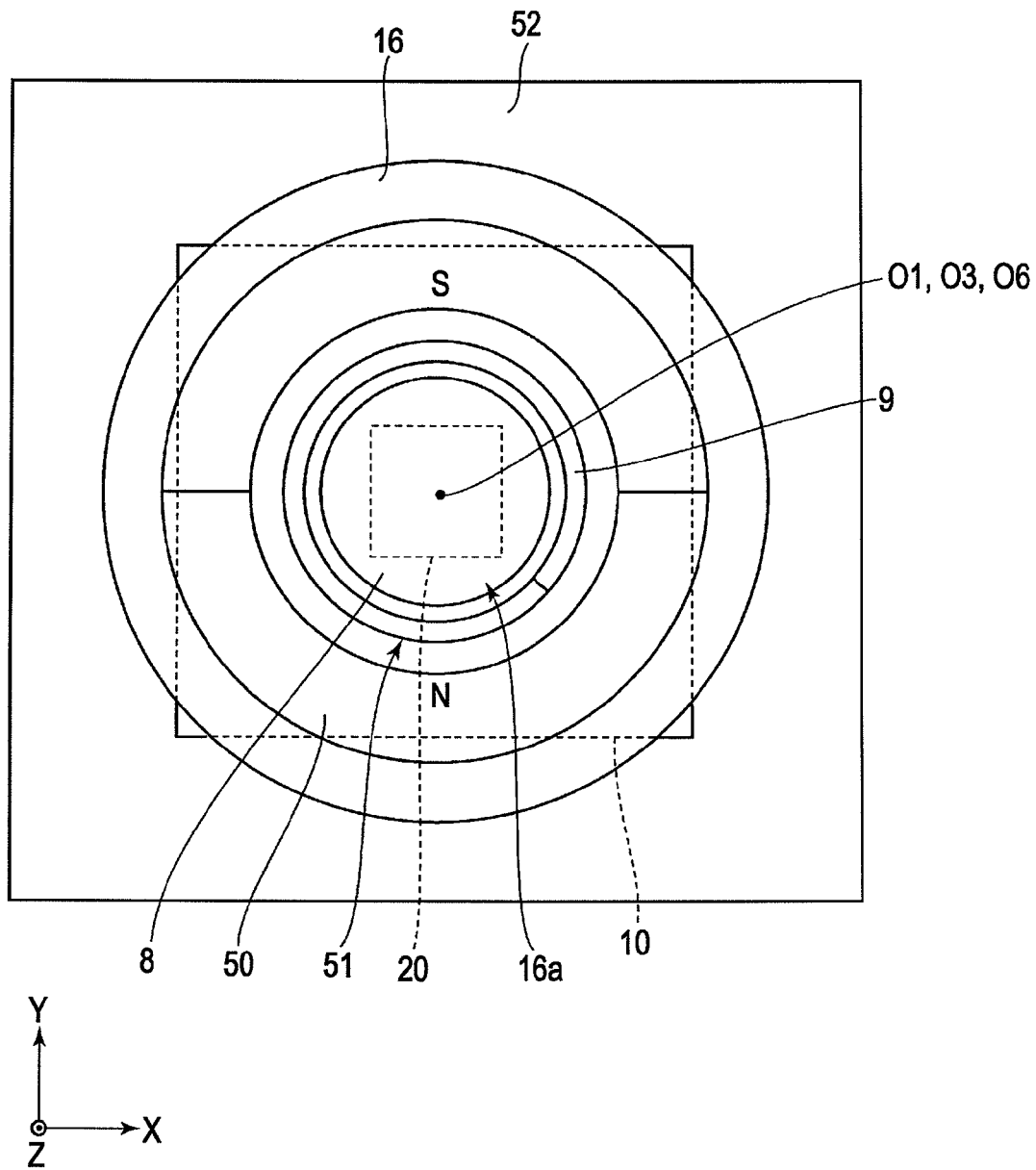
FIG. 13 is a plan view showing the input device in FIG. 12 (a shutter release button, the rotary member, and a part of the camera body not shown)
Figure 14:
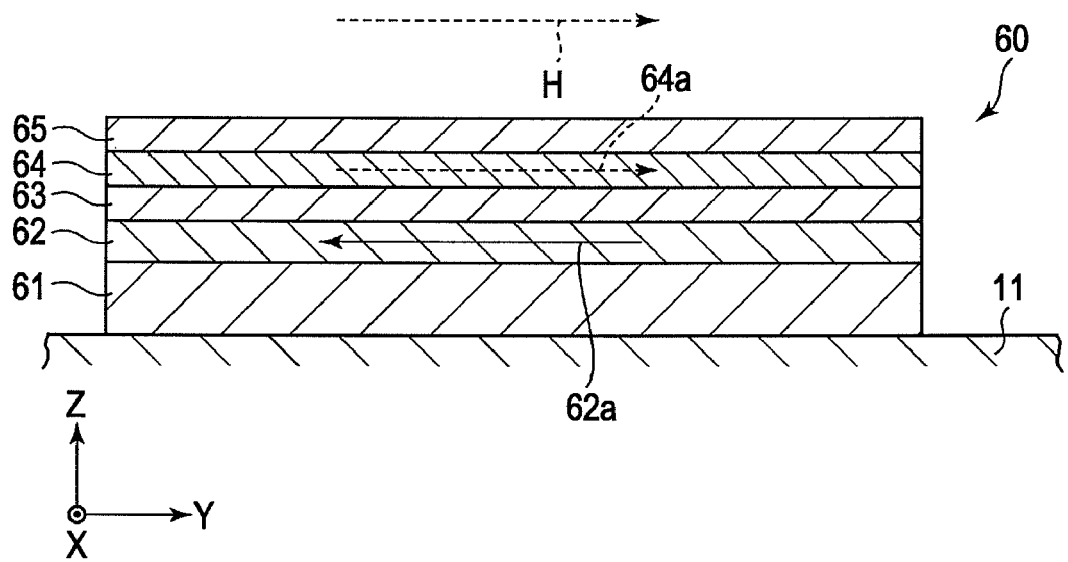
FIG. 14 is a cross-sectional view showing a layer structure of a giant magnetoresistive element (GMR element) in a magnetic sensor according to this embodiment.
Figure 15:
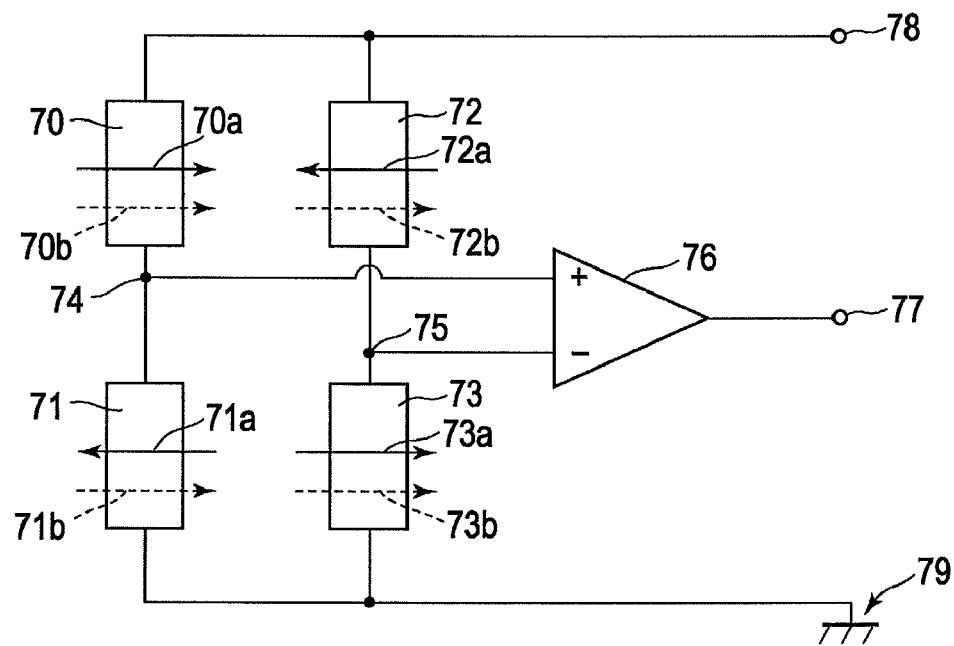
FIG. 15 is a circuit diagram for the magnetic sensor according to this embodiment.

FIG. 1 is an external perspective view showing a camera. FIG. 2 is an exploded perspective view showing an input device according to a first embodiment of the present invention (a rotary member not shown). FIG. 3 is a side view showing the input device in FIG. 2 (the rotary member and a part of a camera body shown in a cross-sectional manner). FIG. 4 is a plan view showing the input device in FIG. 3 (a shutter release button, the rotary member, and a part of the camera body not shown). FIGS. 5 and 6 are schematic illustrations each showing a rotation range of the magnet and a rotational magnetic field acting on a magnetic sensor. FIG. 7 is a front view showing the input device in FIG. 2 (a holder not shown). FIGS. 8, 9, and 10 are plan views each showing a magnet having a form different from the magnet shown in FIG. 4. FIG. 11 is an exploded perspective view showing an input device according to a second embodiment of the present invention. FIG. 12 is a side view showing the input device in FIG. 11 (a rotary member and a part of a camera body shown in a cross-sectional manner). FIG. 13 is a plan view showing the input device in FIG. 12 (a shutter release button, the rotary member, and a part of the camera body not shown). FIG. 14 is a cross-sectional view showing a layer structure of a giant magnetoresistive element (GMR element) in a magnetic sensor according to this embodiment. FIG. 15 is a circuit diagram for the magnetic sensor according to this embodiment.

A camera 1 shown in FIG. 1 includes a camera body (casing) 2; a lens section 3 and a flashlight section 4 in the front surface of the camera body 2; and a shutter release button (push button) 5 and a rotary member 7 surrounding the periphery of the shutter release button 5 on the upper surface of the camera body 2. A zoom lever 6 protrudes from a part of an outer peripheral portion of the rotary member 7. Although not shown, a monitor section and various buttons are provided at the rear surface of the camera body 2.

Referring to FIGS. 2 and 3, a pressing protrusion 8 protrudes downward (in a direction opposite to the Z direction in the drawing) from a lower surface 5a of the shutter release button 5. Referring to FIGS. 2 to 4, the pressing protrusion 8 has a substantially columnar shape. The lower surface of the pressing protrusion 8 serves as a pressing surface that presses the upper surface of a tact switch 10 (described below).

The pressing protrusion 8 may be integrally provided with the shutter release button 5, or may be provided separately from the shutter release button 5.

A coil spring 9 is provided around the pressing protrusion 8. The coil spring 9 urges the shutter release button 5 upward (in the Z direction in the drawing).

A tact switch (switch section) 10 on a substrate 11 is provided below the pressing protrusion 8.

A gap is interposed between the pressing protrusion 8 and the tact switch 10 in the assembled state in FIG. 3. When the shutter release button 5 is pressed downward, the lower surface of the pressing protrusion 8 presses the upper surface of the tact switch 10 downward. In response to this, a switch input signal is transmitted to a drive circuit (not shown) in the camera body 2, and a shutter-releasing operation is actuated.

Referring to FIG. 3, the rotary member 7 has a through hole 7a at a center portion thereof, so that the shutter release button 5 and the pressing protrusion 8 extend through the through hole 7a. The rotary member 7 includes a front-surface portion 12 and a cylindrical leg portion 13. The front-surface portion 12 is located close to the front surface. The zoom lever 6 is coupled to the front-surface portion 12. The leg portion 13 is located below the front-surface portion 12. The leg portion 13 has a smaller portion of the through hole 7a than a portion of the through hole 7a in the front-surface portion 12. The leg portion 13 is located around the pressing protrusion 8 in the assembled state.

Referring to FIG. 3, the leg portion 13 has an upper surface 13a serving as a regulation surface that inhibits the shutter release button 5 from being pressed further downward. In the assembled state, a space 14 is provided between the regulation surface 13a and the lower surface 5a of the shutter release button 5. The space 14 allows the shutter release button 5 to be pressed downward by only a predetermined distance.

The rotary member 7 is urged to maintain a neutral position (reference position, not-rotated state) in FIGS. 3 and 4 when an external force is not exerted on the rotary member 7. The "reference position" in the use state without an urging force exerted on the rotary member 7 represents a state that the center O2 of a magnet 15 and the center O3 of a magnetic sensor 20 are arranged in a line in the width direction (the X direction in the drawing) as shown in FIG. 4.

To prevent the rotary member 7 from coming off or rattling, for example, an engagement structure having a recess and a protrusion is provided between an outer peripheral part 12a of the front-surface portion 12 and the camera body 2.

The rotary member 7 is supported rotatably around the center of the shutter release button 5 as the rotation center. In this first embodiment, the center of the shutter release button 5 is aligned with the center O1 of the pressing protrusion 8. Thus, the rotary member 7 is supported at the periphery of the shutter release button 5 rotatably around the center O1 of the pressing protrusion 8 as the rotation center by only a predetermined angle. Hereinafter, the rotation center is described as the center O1 of the pressing protrusion 8 unless otherwise noted.

Referring to FIG. 3, a holder 16 is attached to a lower surface 13b of the leg portion 13 of the rotary member 7. The holder 16 holds the magnet (magnetic-field generating member) 15 (see also FIG. 2). Referring to FIGS. 2 and 4, the holder 16 has a through hole 16a at a center portion thereof. The pressing protrusion 8 can extend through the through hole 16a. In addition, the magnet 15 held by the holder 16 has a through hole 17 at a center portion thereof.

The magnet 15 is held by the holder 16, and the holder 16 is coupled to the rotary member 7. When the rotary member 7 is rotated around the center O1 of the pressing protrusion 8 as the rotation center, the magnet 15 is also rotated in association with the rotation of the rotary member 7.

Referring to FIGS. 2 and 4, the magnet 15 has a ring-like shape having the through hole 17 at the center portion thereof and being long in the width direction (the X direction in the drawing).

At the neutral position (the reference position) shown in FIG. 4, an aspect ratio (T1/L1) is larger than 1, where T1 is a center width in the width direction (the X direction in the drawing) of the through hole 17, the center width T1 passing through the center O2 of the through hole 17 in the magnet 15 and the center O1 of the pressing protrusion 8; and L1 is a center length in the length direction (the Y direction in the drawing) of the through hole 17, the center length L1 being orthogonal to the center width T1 at the center O2 of the through hole 17. In this embodiment, the aspect ratio (T1/L1) is preferably in a range from 2 to 4.

A half of the magnet 15 is polarized to the N-pole and the other half is polarized to the S-pole with respect to the center width T1 as the boundary.

Referring to FIGS. 2 to 4, the magnetic sensor 20 and the tact switch 10 are arranged side by side on the substrate 11.

Referring to FIGS. 2 and 4, the magnetic sensor 20 is located at a position to face the through hole 17 in the magnet 15 in the height direction (the Z direction in the drawing). Referring to FIG. 4, at the neutral position (the reference position), the center O1 of the pressing protrusion 8, the center O2 of the through hole 17 in the magnet 15, and the center O3 of the magnetic sensor 20 are arranged in a line.

At any position other than the neutral position (the reference position) shown in FIG. 4, the magnetic sensor 20 is constantly located at the position to face the through hole 17 in the magnet 15 in the height direction (the Z direction in the drawing) within a rotation range of the magnet 15 because of the rotation of the rotary member 7.

Accordingly, a rotational magnetic field H generated by the magnet 15 acts on the magnetic sensor 20 in an in-plane direction parallel to the X-Y plane in the drawing because of the rotation of the rotary member 7. The magnetic sensor 20 can detect the rotational magnetic field H.

When the zoom lever 6 shown in FIG. 1 is rotated in a predetermined direction, the magnet 15 held by the holder 16 is rotated in association with the rotation of the zoom lever 6. Thus, the rotational magnetic field H acts on the magnetic sensor 20 from the magnet 15. The output value of the magnetic sensor 20 changes when the magnetic sensor 20 detects the rotational magnetic field H. The output value is transmitted to the drive circuit in the camera body 2. The camera body 2 judges whether the zoom lever 6 is rotated toward the wide-angle end (W) or toward the telephoto end (T) on the basis of the output value, and actuates a predetermined zooming operation. A sensor mechanism using the magnetic sensor 20 can obtain a linear output value because of the rotation of the rotary member 7. Hence, multistep rotation detection can be easily performed on the basis of the output value. This arrangement is suitable for high-magnification zooming.

For example, the rotation range of the zoom lever 6 is determined in a range from 20 to 35 degrees from the neutral position (the reference position) for either of clockwise and counterclockwise rotation.

The structure of this embodiment includes the tact switch 10 that is turned on when the shutter release button 5 is pressed, and the sensor mechanism that detects the rotation of the rotary member 7 by using the magnet 15 and the magnetic sensor 20. In this embodiment, the magnet 15 has the through hole 17, the pressing protrusion 8 coupled to the shutter release button 5 extends through the through hole 17, and the magnetic sensor 20 is arranged on the substrate 11 provided with the tact switch 10, at the position to face the through hole 17 in the magnet 15 in the height direction (the Z direction in the drawing).

The magnetic sensor 20 detects the rotational magnetic field H generated by the magnet 15 because of the rotation of the rotary member 7. The magnetic sensor 20 is constantly non-contact with the magnet 15. Thus, the size of the magnetic sensor 20 can become markedly smaller than, for example, a mechanical switch or a sliding switch, for example, disclosed in the document '718. In particular, each of the width and length of the magnetic sensor 20 may be within a range from 1 to 2 mm, and the thickness thereof may be within a range from 0.4 to 1 mm. Also, the magnetic sensor 20 and the tact switch 10 can be arranged at positions close to one another. Thus, even when the tact switch 10 and the magnetic sensor 20 are arranged side by side on the substrate 11, the size of the substrate 11 can be small.

Since the magnet 15 is located at the position such that the pressing protrusion 8 can extend through the through hole 17, at least a part of the magnet 15 can be located directly below the shutter release button 5. The magnet 15 is located at the position close to the magnetic sensor 20 arranged at the position to face the through hole 17 in the height direction (the Z direction in the drawing). The rotational magnetic field H is merely applied to the closely arranged magnetic sensor 20. Hence, the thickness of the magnet 15 can be small, and the magnet 15 can be properly arranged in the limited gap between the shutter release button 5 and the substrate 11. Accordingly, the structure of this embodiment can attain the input device that is reduced in size.

Also, since the magnetic sensor 20 does not contact the magnet 15, the life of the these members can be increased.

Further, since the sensor mechanism using the magnetic sensor 20 detects the rotation of the rotary member 7, the linear output because of the rotation can be obtained. The multistep detection (high-magnification zooming) can be properly and easily provided.

In the first embodiment, however, the magnetic sensor 20 cannot be located directly below the pressing protrusion 8 because the tact switch 10 is located directly below the pressing protrusion 8 that is rotated around the center O1 as the rotation center. Thus, in the first embodiment, the magnetic sensor 20 arranged with the tact switch 10 side by side on the substrate 11 has to be arranged at a position shifted from the position directly below the pressing protrusion 8. For example, when the center O1 of the pressing protrusion 8 is shifted from the center of the shutter release button 5, that is, when the center O1 of the pressing protrusion 8 is arranged at a position shifted from the rotation center, the tact switch 10 is shifted from the rotation center. The magnetic sensor 20 can be arranged at the rotation center. However, the pressing protrusion 8 and the tact switch 10 are preferably arranged at the position below the center of the shutter release button 5 in order to attain a reliable switch-input operation, a simple mechanism, and efficient arrangement of all parts shown in FIG. 2 within the limited space.

The magnet 15 is supported such that the pressing protrusion 8 can extend through the through hole 17. The center O2 of the magnet 15 may be aligned with the center O1 of the pressing protrusion 8. In this case, however, the magnet 15 may protrude to an unused space on the left in the FIG. 4 with respect to the pressing protrusion 8. This may be disadvantageous to the reduction in size of the input device. Owing to this, referring to FIG. 4, the center (the rotation center of the rotary member 7) O1 of the pressing protrusion 8 and the center O2 of the magnet 15 are preferably shifted from one another in the width direction (the X direction in the drawing). When the magnet 15 has a circular through hole 17 and has the center width T1 shown in FIG. 4, the size of the magnet 15 becomes markedly large. This may be disadvantageous to the reduction in size of the input device. Also, when the through hole 17 is circular, the magnetic sensor 20 tends to receive a nonlinear rotational magnetic field H when the magnet 15 is rotated, and hence, the magnetic sensor 20 may not accurately detect the rotation of the magnet 15 as long as this embodiment cannot have the positional relationship that the center O2 of the through hole 17, the center O1 of the pressing protrusion 8 serving as the rotation center, and the center O3 of the magnetic sensor 20 are aligned with one another (meanwhile, these centers are aligned with one another in a second embodiment to be described later).

Therefore, in this embodiment having the aforementioned positional relationship among the magnetic sensor 20, the pressing protrusion 8, and the magnet 15, the magnet 15 preferably has the shape described below so that the magnetic sensor 20 can accurately detect the rotation.

As shown in FIG. 4, the aspect ratio (T1/L1) of the center width T1 to the center length L1 of the through hole 17 in the magnet 15 is preferably larger than 1. Also, as shown in FIG. 4, both side portions 17a of the through hole 17 are preferably parallel to the width direction (the X direction in the drawing), both the side portions 17a facing one another with a gap interposed therebetween in the length direction over the center width T1. Further, as shown in FIG. 4, the half of the magnet 15 is polarized to the N-pole and the other half is polarized to the S-pole with respect to the center width T1 in the width direction as the boundary.

Referring to FIGS. 5 and 6, the solid line for the magnet 15 indicates the neutral position (the reference position). The dotted line in FIG. 5 indicates the state when the magnet 15 is rotated counterclockwise by a predetermined angle. The dotted line in FIG. 6 indicates the state when the magnet 15 is rotated clockwise by a predetermined angle. As long as the magnet 15 has the above-mentioned preferable shape, within the rotation range of the rotary member 7 shown in FIG. 5 or 6, a linear rotational magnetic field H (indicated by a solid-line arrow or a dotted-line arrow shown in FIG. 5, 6, or 7) can be constantly generated from the N-pole to the S-pole in the X-Y plane in a lower space A (see FIG. 7 showing the neutral position) accommodating the magnetic sensor 20 and located below the space between both the side portions 17a of the through hole 17 in the magnet 15. As described above, in this embodiment, the linear rotational magnetic field H tends to act on the magnetic sensor 20 within the rotation range of the rotary member 7. The magnetic sensor 20 can accurately detect the magnetic field.

Also, as shown in FIG. 4, the center O1 of the pressing protrusion 8 is preferably located at a position separated from the center O2 of the through hole 17 in the magnet 15. In addition, at the neutral position (the reference position), the center O1 of the pressing protrusion 8, the center O2 of the through hole 17, and the center O3 of the magnetic sensor 20 are preferably arranged in a line in that order.

Accordingly, because of the compact magnet 15, the installation area for the magnetic sensor 20 located at the position to face the through hole 17 in the height direction (the Z direction in the drawing) can be widened on the one side with respect to the pressing protrusion 8. Thus, the magnetic sensor 20 and the tact switch 10 can be more easily arranged side by side on the substrate 11. When the rotary member 7 (the magnet 15) is rotated counterclockwise or clockwise as shown in FIG. 5 or 6 from the neutral position (the reference position) as shown in FIG. 4, the rotation range of the rotary member 7 for maintaining the state that the magnetic sensor 20 faces the through hole 17 in the height direction (the Z direction in the drawing) can be equally determined for the counterclockwise or clockwise rotation.

The other shapes of the magnet according to this embodiment will be described. A magnet 30 shown in FIG. 8 has a through hole 31 at a center portion thereof. Similar to the magnet 15 shown in FIG. 4, an aspect ratio (T1/L1) of a center width T1 to a center length L1 of the through hole 31 is larger than 1. In FIG. 8, however, both side portions 31a of the through hole 31 facing one another with a gap interposed therebetween in the length direction (the Y direction in the drawing) over the center length T1 have curved surfaces. Hence, the through hole 31 has an ellipsoidal shape. When the through hole 31 in the magnet 30 has the ellipsoidal shape, a rotational magnetic field H acting on the magnetic sensor 20 tends to be more linear as compared with a through hole in the magnet having a circular shape. However, the rotational magnetic field H acting on the magnetic sensor 20 tends to have a larger amount of a non-linear component as compared with the form of the magnet 15 shown in FIG. 4, likely resulting in the detection accuracy being degraded. Hence, the shape of the magnet shown in FIG. 4 is more preferable than the shape of the magnet shown in FIG. 8.

A magnet 40 shown in FIG. 9 has a through hole 41 at a center portion thereof. Similar to the magnet 15 shown in FIG. 4, an aspect ratio (T1/L1) of a center width T1 to a center length L1 of the through hole 41 is larger than 1. In FIG. 9, the through hole 41 has both side portions 41a and both side portions 41b. Both the side portions 41a face one another with a gap interposed therebetween in the length direction (the Y direction in the drawing) over the center width T1. Both the side portions 41b face one another with a gap interposed therebetween in the width direction (the X direction in the drawing) over the center length L1 and are parallel to the length direction (the Y direction in the drawing). Hence, similar to the shape of the magnet shown in FIG. 4, the shape of the magnet shown in FIG. 9 allows a linear rotational magnetic field H to tend to act on the magnetic sensor 20 within a rotation range of the rotary member 7. The magnetic sensor 20 can accurately detect the magnetic field.

The magnetic-field generating member according to this embodiment does not have to be completely formed of a magnet. For example, a ring-like support member having the form similar to the magnet 15 shown in FIG. 4 may be provided. At least a magnet having a lower surface (surface facing the magnetic sensor 20) polarized to the N-pole may be arranged on the lower surface of a half of the ring-like support member with respect to a center width T1 of the ring-like member in the width direction, and at least a magnet having a lower surface (surface facing the magnetic sensor 20) polarized to the S-pole may be arranged on the lower surface of the other half of the ring-like support member. At the neutral position (the reference position) shown in FIG. 4, each pair of the magnets having the lower surfaces polarized to the N-pole and S-pole are preferably arranged at positions close to the position of the magnetic sensor 20 such that the centers of the magnets are arranged in a line in the length direction (the Y direction). In addition, at the neutral position (the reference position) shown in FIG. 4, a pair of the magnets are preferably arranged in a line such that the centers of the magnets and the center O3 of the magnetic sensor 20 are arranged in a line in the length direction (the Y direction).

Any of the shapes of the above-described magnetic-field generating members has the through hole at the center portion thereof. Alternatively, for example, as shown in FIG. 10, two bar magnets 81 and 82 may be prepared. The bar magnets 81 and 82 have lower surfaces having polarities different from one another. A rotational magnetic field H can be applied to lower space A accommodating the magnetic sensor 20 as shown in FIG. 7. Even a single bar magnet may generate a rotational magnetic field H, however, components other than horizontal components in the X-Y plane are increased and the magnetic field cannot be properly detected. Thus, the two bar magnets 81 and 82 are preferably prepared to generate the rotational magnetic field H properly as shown in FIG. 10. Still alternatively, a small magnet may be provided on the lower surface of a rod-like member instead of the bar magnet, to generate a rotational magnetic field H.

As shown in FIG. 7, in the above-described embodiment, the magnetic sensor 20 is located below any of the magnets (magnetic-field generating members). If no serious disadvantage is expected, the magnet may be arranged at a position in the same plane as the magnetic sensor 20 (or in a slightly lifted state). However, the magnet 15 can become more compact when the magnet 15 is located above the magnetic sensor 20 as shown in FIG. 7. The thickness of the magnet 15 is sufficiently smaller than the gap between the shutter release button 5 and the substrate 11. Accordingly, the magnetic field can be properly detected and the input device can be properly reduced in size.

FIGS. 11 through 13 illustrate an input device according to a second embodiment of the present invention. Like reference numerals refer members similar to those shown in FIGS. 2 to 4. Different reference numerals refer members having different shapes from those shown in FIGS. 2 to 4, however, such members have functions similar to those shown in FIGS. 2 to 4. The details of these members have been described above, and hence, refer to the description with reference to FIGS. 2 to 4.

In the second embodiment shown in FIGS. 11 to 13, the magnetic sensor 20 is provided on a lower surface 52b of a substrate 52 provided with the tact switch 10 on the upper surface of the substrate 52. A magnet 50 is held by a holder 53 and has a through hole 51 at a center portion thereof. The magnetic sensor 20 faces the through hole 51 in the height direction (in the Z direction in the drawing) within the rotation range of the rotary member 7.

Similar to the input device according to the first embodiment shown in FIGS. 2 to 4, the input device according to the second embodiment has the magnetic sensor 20 that detects a rotational magnetic field H generated by the magnet 50 because of the rotation of the rotary member 7. The magnetic sensor 20 is constantly non-contact with the magnet 50. Thus, the size of the magnetic sensor 20 can become markedly smaller than, for example, a mechanical switch or a sliding switch, for example, disclosed in the document '718.

The magnet 50 has the through hole 51 at the center portion thereof. The pressing protrusion 8 serving as the rotation center of the rotary member 7 can extend through the through hole 51. Accordingly, at least a part of the magnet 50 can be located directly below the shutter release button 5. With the second embodiment shown in FIGS. 11 to 13, the entire magnet 50 can be located directly below the shutter release button 5. Further, the magnet 50 can be properly arranged in a limited gap between the shutter release button 5 and the substrate 52. As described above, with the structure of this embodiment, the input device reduced in size can be provided. With the second embodiment shown in FIGS. 11 to 13, the magnetic sensor 20 is arranged on the lower surface 52b of the substrate 52. Although the dimension of the input device in the height direction is larger than that of the first embodiment shown in FIGS. 2 to 4, since the thickness of the magnetic sensor 20 is about 1 mm, the input device can be entirely reduced in size as compared with the input device of the related art.

Also, the magnetic sensor 20 does not contact the magnet 50, the long life of the members are expected.

Further, since the sensor mechanism using the magnetic sensor 20 detects the rotation of the rotary member 7, the linear output because of the rotation can be obtained. The multistep detection (high-magnification zooming) can be properly and easily provided.

With the second embodiment shown in FIGS. 11 to 13, the tact switch 10 and the substrate 52 are interposed between the magnet 50 and the magnetic sensor 20, and hence the gap between the magnet 50 and the magnetic sensor 20 tends to be increased as compared with the first embodiment shown in FIGS. 2 to 4. Thus, the input device according to the first embodiment is more preferable than the input device according to the second embodiment to arrange the magnet and the magnetic sensor 20 at positions close to one another and to accurately detect the rotation with a small noise component.

In the second embodiment shown in FIGS. 11 to 13, while the through hole 51 formed at the center portion of the magnet 50 has the circular shape, the center O3 of the magnetic sensor 20, the center O6 of the through hole 51, and the center O1 (rotation center) of the pressing protrusion 8 are aligned with one another in the height direction (the Z direction in the drawing). Thus, a linear rotational magnetic-field H tends to be applied from the magnet 50 to the magnetic sensor 20 as compared a case that the center O3 of the magnetic sensor 20 is separated from the center O6 of the through hole 51 and from the center O1 of the pressing protrusion 8. Herein, any of the magnets having the shapes shown in FIGS. 4, 8, and 9 may be employed.

The layer structure of a giant magnetoresistive element (GMR element) 60 embedded in the magnetic sensor 20 will be described.

Referring to FIG. 14, the giant magnetoresistive element 60 includes a antiferromagnetic layer 61, a pinned magnetic layer 62, a nonmagnetic material layer 63, a free magnetic layer 64, and a protective layer 65, the layers being laminated on the substrate 11 in that order from the bottom. The antiferromagnetic layer 61 is made of, for example, IrMn, the pinned magnetic layer 62 is made of, for example, CoFe, the nonmagnetic material layer 63 is made of, for example, Cu, the free magnetic layer 64 is made of, for example NiFe, and the protective layer 65 is made of, for example, Ta. A base layer may be formed between the antiferromagnetic layer 61 and the substrate 11, or the laminated order of the layers may be opposite to the above-mentioned order. However, a three-layer structure including at least the pinned magnetic layer 62, the nonmagnetic material layer 63, and the free magnetic layer 64 has to be provided.

An exchange magnetic field (Hex) is generated between the antiferromagnetic layer 61 and the pinned magnetic layer 62. Hence, a magnetization direction 62a of the pinned magnetic layer 62 is pinned in one direction. In this embodiment, the magnetization direction 62a of the pinned magnetic layer 62 is pinned, for example, in a direction opposite to the Y direction in the drawing.

In contrast, a magnetization direction 64a of the free magnetic layer 64 is not pinned, and is headed along the active rotational magnetic field H. Referring to FIG. 14, the rotational magnetic field H acts in the plane parallel to the X-Y plane in the drawing. That is, the rotational magnetic field H has a horizontal magnetic field component acting in the in-plane direction parallel to the interfaces among the layers. When the magnetization direction 64a of the free magnetic layer 64 receives such a horizontal magnetic field component, the magnetization direction 64a is changed into the rotational magnetic field H.

In FIG. 14, the magnetization direction 64a of the free magnetic layer 64 is headed in the Y direction in the drawing. The magnetization direction 62a of the pinned magnetic layer 62 and the magnetization direction 64a of the free magnetic layer 64 are antiparallel to one another, causing a maximum electric resistance. In contrast, when the magnetization direction 64a of the free magnetic layer 64 is headed in a direction opposite to the Y direction in the drawing, the magnetization direction 62a of the pinned magnetic layer 62 is headed in the same direction as the magnetization direction 64a of the free magnetic layer 64, causing a minimum electric resistance.

When the giant magnetoresistive element 60 receives the rotational magnetic field H, the magnetization direction 64a of the free magnetic layer 64 is changed. On account of the magnetization relationship between the magnetization direction 64a of the free magnetic layer 64 and the magnetization direction 62a of the pinned magnetic layer 62, the resultant electric resistance is changed. Thus, the rotation state of the rotary member 7 can be linearly detected on the basis of the change in output in accordance with the change in electric resistance.

Referring to FIG. 15, the giant magnetoresistive element 60 preferably defines a bridge circuit.

Reference numeral 70 denotes a first giant magnetoresistive element, 71 denotes a second giant magnetoresistive element, 72 denotes a third giant magnetoresistive element, and 73 denotes a fourth giant magnetoresistive element. Each of the giant magnetoresistive elements 70, 71, 72, and 73 has the layer structure of the giant magnetoresistive element 60 shown in FIG. 14.

Referring to FIG. 15, the first giant magnetoresistive element 70 and the second giant magnetoresistive element 71 are connected to one another in series through a first output extracting portion 74. Also, the third giant magnetoresistive element 72 and the fourth giant magnetoresistive element 73 are connected to one another in series through a second output extracting portion 75.

Referring to FIG. 15, the first output extracting portion 74 and the second output extracting portion 75 are connected to a differential amplifier 76. The output side of the differential amplifier 76 is connected to an external output terminal 77.

Referring to FIG. 15, the first giant magnetoresistive element 70 and the third giant magnetoresistive element 72 are connected to one another through an input terminal 78. Also, the second giant magnetoresistive element 71 and the fourth giant magnetoresistive element 73 are connected to one another through a ground terminal 79.

Referring to FIG. 15, a pinned magnetization direction 70a of a pinned magnetic layer of the first giant magnetoresistive element 70 is antiparallel to a pinned magnetization direction 71a of a pinned magnetic layer of the second giant magnetoresistive element 71.

A pinned magnetization direction 72a of a pinned magnetic layer of the third giant magnetoresistive element 72 is the same as the pinned magnetization direction 71a of the pinned magnetic layer of the second giant magnetoresistive element 71. Also, a pinned magnetization direction 73a of a pinned magnetic layer of the fourth giant magnetoresistive element 73 is the same as the pinned magnetization direction 70a of the pinned magnetic layer of the first giant magnetoresistive element 70. That is, as shown in FIG. 15, the pinned magnetization direction 72a of the third giant magnetoresistive element 72 and the pinned magnetization direction 73a of the fourth giant magnetoresistive element 73 both connected to one another in series are antiparallel to one another.

The giant magnetoresistive elements 70, 71, 72, and 73 shown in FIG. 15 are provided on the substrate of the magnetic sensor 20. Also, the differential amplifier 76 and an integrated circuit (IC) including a comparator etc., not shown, are provided on the substrate of the magnetic sensor 20. For example, an integrated circuit is formed on the substrate, an insulating layer is provided thereon, and the giant magnetoresistive elements 70, 71, 72, and 73 are provided thereon in a meander form. The giant magnetoresistive elements 70, 71, 72, and 73 may be covered with a protective layer, and hence become packaged. Also, the input terminal 78, the ground terminal 79, and the external output terminal 77 are exposed from the side surface of the magnetic sensor 20.

The dotted arrows in the giant magnetoresistive elements 70, 71, 72, and 73 indicate magnetization directions 70b, 71b, 72b, and 73b of free magnetic layers. As described above, the magnetization direction of a free magnetization layer is headed in the direction along the rotational magnetic field H. Hence, the magnetization directions of the free magnetic layers of all giant magnetoresistive elements 70, 71, 72, and 73 are headed in the same direction.

In the magnetized state shown in FIG. 15, the first giant magnetoresistive element 70 and the fourth giant magnetoresistive element 73 cause a minimum resistance, and the second giant magnetoresistive element 71 and the third giant magnetoresistive element 72 cause a maximum resistance.

Figure 16:
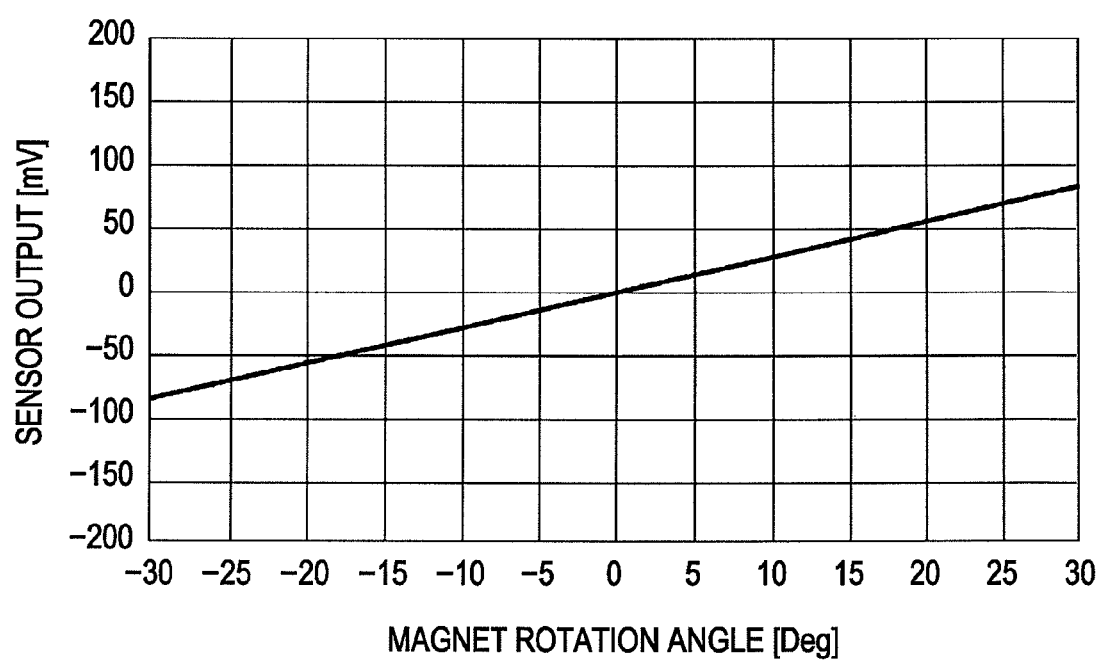
FIG. 16 illustrates an exemplary relationship between a magnet rotation angle and a sensor output.

Since the rotational magnetic field H applied by the magnet because of the rotation of the rotary member 7 acts on the giant magnetoresistive elements 70, 71, 72, and 73, the electric resistances of the giant magnetoresistive elements 70, 71, 72, and 73 are changed, and hence, a differential potential is output from the bridge circuit through the differential amplifier 76. For example, the sensor output (differential potential) appears as shown in FIG. 16 with respect to a magnet rotation angle.

For example, at the neutral position (the reference position) shown in FIG. 4, the pinned magnetization directions 70a, 71a, 72a, and 73a of the pinned magnetic layers are respectively at 90 degrees to the magnetization directions 70b, 71b, 72b, and 73b of the free magnetic layers in all giant magnetoresistive elements 70, 71, 72, and 73. The electric resistances of all giant magnetoresistive elements 70, 71, 72, and 73 are the same.

Accordingly, the sensor output (the differential potential) is 0 V. When the magnet 15 is rotated because of the rotation of the rotary member 7 from the neutral position (the reference position) shown in FIG. 4 counterclockwise by 30 degrees (for example, to a magnet rotation angle of a positive value in FIG. 16) or clockwise by 30 degrees (for example, to a magnet rotation angle of a negative value in FIG. 16), the sensor output (the differential potential), on the basis of the changes in electric resistances of the giant magnetoresistive elements 70, 71, 72, and 73 is linearly changed as shown in FIG. 16.

The sensor output (the differential potential) exhibits different signs in terms of positive and negative between the counterclockwise and clockwise rotation of the magnet 15 from the neutral position (the reference position) shown in FIG. 4. Hence, the rotation direction of the magnet 15 can be judged by referring to that sign. Thus, a wide-angle end zooming signal and a telephoto end zooming signal can be easily and properly generated. In addition, since the sensor output is changed in a linear form with respect to the magnet rotation angle as shown in FIG. 16, the multistep zooming operation can be properly and easily actuated.

The magnetic element used in the magnetic sensor 20 does not have to be the giant magnetoresistive element (GMR element). However, as described above, when the magnetic sensor 20 receives the horizontal magnetic field component and the electric characteristic thereof is changed, and when the magnet 15 is rotated clockwise and counterclockwise, the rotation direction has to be judged. The giant magnetoresistive element is the most suitably serves as such a magnetic element. In addition, using the giant magnetoresistive element, the electric resistance is properly changed even with a weak magnetic field. Thus, the magnet can be reduced in size, and hence the input device can be effectively reduced in size.

Also, the differential output can be obtained as long as the giant magnetoresistive elements define the bridge circuit as shown in FIG. 15, and the sensor output can be increased. Thus, the magnetic field can be further accurately detected. Herein, it is to be noted that a circuit may include two giant magnetoresistive elements connected to one another in series, the giant magnetoresistive elements including pinned magnetic layers having magnetization directions being antiparallel to one another. Alternatively, a circuit may include merely a single giant magnetoresistive element.

In these embodiments, the input device has been described as an input device for shutter releasing and zooming for a camera. However, any of these embodiments can be applied to an electronic device other than a camera.

The invention claimed is:

1. An input device, comprising:
a push button, a pressing protrusion coupled to a lower surface of the push button and protruding downward, and a switch section located below the pressing protrusion and configured to be pressed when the push button is pressed downward; and
a rotary member supported at the periphery of the push button rotatably around the center of the push button as a rotation center, a magnetic-field generating member located below the rotary member and configured to be rotated in association with rotation of the rotary member, and a magnetic sensor configured to detect a rotational magnetic field that is generated by the magnetic-field generating member because of the rotation of the rotary member,
wherein the magnetic-field generating member has a through hole at the center thereof and is supported in such a manner as the pressing protrusion can extend through the through hole,
wherein the magnetic sensor and the switch section are arranged side by side on a substrate, and the magnetic sensor is located at a position to face the through hole in a height direction within a rotation range, and
wherein the center of the pressing protrusion is aligned with the rotation center; at a reference position (not-rotated state), a ratio (T1/L1) of a center width T1 in a width direction of the through hole to a center length L1 in a length direction of the through hole is larger than 1, the center width T1 passing through the center of the through hole and the center of the pressing protrusion, the center length L1 being orthogonal to the center width T1 at the center of the through hole; at least a part of a half of the magnetic-field generating member and at least a part of the other half of the magnetic-field generating member with respect to the center width T1 in the width direction as the boundary are polarized to different polarities; and the magnetic sensor is arranged at a position separated from the rotation center in the width direction of the through hole.

2. The input device according to claim 1, wherein the rotation center is shifted from the center of the magnetic-field generating member in the width direction.

3. The input device according to claim 2, wherein both side portions of the through hole are parallel to the width direction, both the side portions facing one another with a gap interposed therebetwewn in the length direction over the center width T1.

4. The input device according to claims 1, wherein the center of the through hole is located at a position separated from the center of the pressing protrusion, and the center of the pressing protrusion, the center of the through hole, and the center of the magnetic sensor are arranged in a line in that order.

5. The input device according to claims 1, wherein the magnetic sensor includes a magnetoresistive element having an electric resistance that changes when a magnetization direction thereof changes due to the rotational magnetic field.

6. The input device according to claim 5, wherein a first giant magnetoresistive element and a second giant magnetoresistive element are connected to one another in series through an output extracting portion; each of the first and second giant magnetoresistive elements includes a pinned magnetic layer having a pinned magnetization direction, a free magnetic layer having a magnetization direction that changes due to the rotational magnetic field, and a nonmagnetic material layer located between the pinned magnetic layer and the free magnetic layer; and the magnetization directions of the pinned magnetic layers in the first and second giant magnetoresistive elements are antiparallel to one another.

7. The input device according to claim 6, wherein a third giant magnetoresistive element and a fourth giant magnetoresistive element are connected to one another in series through an output extracting portion; a magnetization direction of a pinned magnetic layer in the third giant magnetoresistive element is the same as the magnetization direction of the pinned magnetic layer in the second giant magnetoresistive element; a magnetization direction of a pinned magnetic layer in the fourth giant magnetoresistive element is the same as the magnetization direction of the pinned magnetic layer in the first giant magnetoresistive element; the first and third giant magnetoresistive elements are connected to one another through an input terminal, the magnetization directions of the pinned magnetic layers in the first and third giant magnetoresistive elements being antiparallel to one another; the second and fourth giant magnetoresistive elements are connected to one another through a ground terminal, the magnetization directions of the pinned magnetic layers in the second and fourth giant magnetoresistive elements being antiparallel to one another; and the two output extracting portions are connected to an external output terminal through a differential amplifier.

8. The input device according to claims 1, wherein the push button is a shutter release button of a camera, and a zoom lever is attached to a part of an outer peripheral portion of the rotary member.

* * * * *

UNITED STATES PATENT AND TRADEMARK OFFICE
CERTIFICATE OF CORRECTION

PATENT NO.       : 8,000,597 B2  
APPLICATION NO.  : 12/652487  
DATED            : August 16, 2011  
INVENTOR(S)      : Takeya et al.

Page 1 of 1

It is certified that error appears in the above-identified patent and that said Letters Patent is hereby corrected as shown below:

On the Title Page

Left column, item (75), replace "Yasunoi Sasaki" with --Yasunori Sasaki--.

In the Claims

In column 16, claim 3, line 7, before "in the length direction" replace "therebetwewn" with --therebetween--.

Signed and Sealed this  
Twenty-second Day of November, 2011

David J. Kappos  
*Director of the United States Patent and Trademark Office*